(12) United States Patent
Tanaka et al.

(10) Patent No.: US 10,710,200 B2
(45) Date of Patent: Jul. 14, 2020

(54) METHOD FOR PRODUCING DEVICE SUPPORT BASE AND LASER CLEANING APPARATUS

(71) Applicant: Sakai Display Products Corporation, Sakai-shi, Osaka (JP)

(72) Inventors: Kohichi Tanaka, Osaka (JP); Katsuhiko Kishimoto, Osaka (JP)

(73) Assignee: Sakai Display Products Corporation, Osaka (JP)

( * ) Notice: Subject to any disclaimer, the term of this patent is extended or adjusted under 35 U.S.C. 154(b) by 92 days.

(21) Appl. No.: 15/774,481

(22) PCT Filed: May 23, 2017

(86) PCT No.: PCT/JP2017/019223
§ 371 (c)(1),
(2) Date: Sep. 13, 2018

(87) PCT Pub. No.: WO2018/216108
PCT Pub. Date: Nov. 29, 2018

(65) Prior Publication Data
US 2019/0358748 A1 Nov. 28, 2019

(51) Int. Cl.
*B23K 26/352* (2014.01)
*B24B 49/12* (2006.01)
*H01L 21/304* (2006.01)

(52) U.S. Cl.
CPC .......... *B23K 26/3576* (2018.08); *B24B 49/12* (2013.01); *H01L 21/304* (2013.01)

(58) Field of Classification Search
CPC .... B23K 26/3576; B24B 49/12; H01L 21/304
(Continued)

(56) References Cited

U.S. PATENT DOCUMENTS 4,473,735 A * 9/1984 Steffen ............... B23K 26/08
219/121.66
4,675,501 A * 6/1987 Klingel ............... B23K 26/04
219/121.67

(Continued)

FOREIGN PATENT DOCUMENTS

| JP | 06170571 A * | 6/1994 | ......... B23K 26/3576 |
| JP | 2000-202385 A | 7/2000 | |

(Continued)

OTHER PUBLICATIONS

Decision to Grant for related Japanese Application No. 2017-566040 dated Apr. 10, 2018.

*Primary Examiner* — Jimmy Chou
(74) *Attorney, Agent, or Firm* — Renner, Otto, Boisselle & Sklar, LLP

(57) ABSTRACT

A method for producing a device support base in an embodiment according to the present disclosure includes step A of providing a support base having a first surface and a second surface parallel to the first surface; step B of forming a laser beam in a first direction parallel to the first surface of the support base; and step C of translating or rotating the laser beam in a second direction parallel to the first surface of the support base and crossing the first direction to remove at least a part of protruding portions or contamination elements on the first surface of the support base.

11 Claims, 6 Drawing Sheets

(58) Field of Classification Search
USPC ............ 219/121.68, 121.69, 121.74, 121.75, 219/121.78, 121.79, 121.76, 121.77, 219/121.83, 121.8, 121.82, 121.61, 219/121.62

See application file for complete search history.

(56) References Cited

U.S. PATENT DOCUMENTS

| | | | | |
|---|---|---|---|---|
| 4,854,696 A * | 8/1989 | Guez | .................... | G03B 17/24 352/90 |
| 5,141,506 A * | 8/1992 | York | .................... | A61F 9/00804 128/898 |
| 5,243,405 A * | 9/1993 | Tichenor | .............. | G01B 11/303 356/600 |
| 5,310,986 A * | 5/1994 | Zumoto | ............ | H01L 21/67092 219/121.68 |
| 5,373,137 A * | 12/1994 | McLaughlin | ........ | B23K 26/067 219/121.68 |
| 5,504,303 A * | 4/1996 | Nagy | .................... | B23K 26/032 219/121.68 |
| 5,575,936 A * | 11/1996 | Goldfarb | .............. | B23K 26/067 219/121.68 |
| 5,684,617 A * | 11/1997 | Langhans | ............ | B23K 26/067 359/205.1 |
| 5,698,120 A * | 12/1997 | Kurosawa | ............ | B23K 26/032 219/121.62 |
| 5,821,497 A * | 10/1998 | Yamazaki | .......... | B23K 26/0838 219/121.69 |
| 5,986,264 A * | 11/1999 | Grunewald | .............. | G01N 1/32 250/310 |
| 6,008,469 A * | 12/1999 | Kawamura | .......... | B23K 26/067 219/121.74 |
| 6,172,328 B1 * | 1/2001 | Jones | .................... | A24C 1/42 219/121.68 |
| 6,252,196 B1 * | 6/2001 | Costin | .................... | B23K 26/03 219/121.69 |
| 6,256,121 B1 * | 7/2001 | Lizotte | .................... | B23K 26/04 359/15 |
| 6,310,701 B1 * | 10/2001 | Lizotte | .................... | B23K 26/04 359/15 |
| 6,537,479 B1 * | 3/2003 | Colea | .................... | B29C 39/026 219/121.6 |
| 6,563,586 B1 * | 5/2003 | Stanke | .................... | B24B 49/12 257/E21.53 |
| 6,596,967 B2 * | 7/2003 | Miesak | .................... | B41M 5/24 219/121.69 |
| 6,617,543 B1 * | 9/2003 | Yang | .................... | A44B 19/262 219/121.69 |
| 6,664,501 B1 * | 12/2003 | Troitski | .............. | C03C 23/0025 219/121.69 |
| 6,717,105 B1 * | 4/2004 | Okamoto | ........... | B23K 26/0738 219/121.76 |
| 6,727,460 B2 * | 4/2004 | Troitski | ............. | B23K 26/0604 219/121.68 |
| 6,961,078 B2 * | 11/2005 | Yamate | .............. | B23K 26/0613 219/121.77 |
| 7,825,350 B2 * | 11/2010 | Fukuyo | .................. | B23K 26/03 219/121.72 |
| 8,030,593 B2 * | 10/2011 | Yoshikawa | .......... | B23K 26/032 219/121.6 |
| 8,615,475 B2 * | 12/2013 | Cowburn | ............. | G07D 7/2033 382/157 |
| 8,686,379 B1 * | 4/2014 | Robinson | ............ | H01J 37/3056 250/307 |
| 9,321,680 B2 * | 4/2016 | Chuang | .................. | C03C 15/00 |
| 10,016,841 B2 * | 7/2018 | Hisada | ............. | B23K 26/0869 |
| 2001/0023862 A1 * | 9/2001 | Hartmann | .............. | B23K 26/04 219/121.83 |
| 2002/0179580 A1 * | 12/2002 | Costin | .................... | B41M 5/24 219/121.68 |
| 2005/0045605 A1 * | 3/2005 | Simke | ................ | B23K 26/0853 219/121.69 |
| 2006/0243713 A1 * | 11/2006 | Sato | ........................ | G02B 26/10 219/121.68 |
| 2007/0215582 A1 * | 9/2007 | Roeper | .............. | B23K 26/0626 219/121.69 |
| 2009/0050611 A1 * | 2/2009 | Sukhman | ................ | B41J 2/471 219/121.79 |
| 2009/0242528 A1 * | 10/2009 | Howerton | .............. | B23K 26/38 219/121.71 |
| 2010/0108651 A1 * | 5/2010 | Stahr | .................... | C03C 23/0025 219/121.69 |
| 2011/0278268 A1 * | 11/2011 | Siman-Tov | ............... | B41C 1/02 219/121.69 |
| 2012/0154084 A1 * | 6/2012 | Yoshizawa | .............. | C22C 38/02 335/297 |
| 2012/0205538 A1 * | 8/2012 | Schertel | ............. | H01J 37/3005 250/307 |
| 2013/0174301 A1 * | 7/2013 | Robinson | ................ | H01J 37/20 850/33 |
| 2015/0028007 A1 * | 1/2015 | Pluss | .................... | B23K 26/40 219/121.69 |

FOREIGN PATENT DOCUMENTS

| | | |
|---|---|---|
| JP | 2001070904 | 3/2001 |
| JP | 2004-103991 A | 4/2004 |
| JP | 2008-213049 A | 9/2008 |
| JP | 2008-300683 A | 12/2008 |
| JP | 2009-271274 A | 11/2009 |

* cited by examiner $$M^2 = \frac{\pi}{\lambda} \cdot R(0) \cdot \theta$$

METHOD FOR PRODUCING DEVICE SUPPORT BASE AND LASER CLEANING APPARATUS

TECHNICAL FIELD

The present disclosure relates to a method for producing a device support base and a laser cleaning apparatus.

BACKGROUND ART

A microscopic protrusion that is present on a top surface of a support base (hereinafter, such a protrusion will be referred to as a "protruding portion") and a foreign object such as a particle or the like attached to the top surface of the support base (hereinafter, such a foreign object will be referred to as "contamination element") may undesirably deteriorate the characteristics of a thin film or an element formed on the support base. For example, in the case where thin film transistors, interconnect lines and insulating layers are to be formed on a support base, such microscopic protruding portions or contamination elements on the top surface of the support base may cause defects to the thin film transistors, disconnect or shortcircuit the interconnect lines, or cause leakage in the insulating layers.

Patent Document No. 1 discloses a microscopic protrusion polishing device that puts a polishing tape into contact with a microscopic protrusion on a flat plate to polish the flat plate.

CITATION LIST

Patent Literature

Patent Document No. 1: Japanese Laid-Open Patent Publication No. 2008-213049

SUMMARY OF INVENTION

Technical Problem

As such a support base is increased in size, a top surface thereof has a larger area size and the number of microscopic protruding portions or contamination elements on the top surface of the support base is increased. In such a state, the method of moving the polishing tape to the positions of the protruding portions or contamination elements to polish the top surface causes the processing time to extend and significantly decreases the mass-productivity.

The present disclosure provides a method for producing a device support base and a laser cleaning apparatus that solve the above-described problems.

Solution to Problem

A method for producing a device support base according to the present disclosure includes step A of providing a support base having a first surface and a second surface parallel to the first surface; step B of forming a laser beam in a first direction parallel to the first surface of the support base; and step C of translating or rotating the laser beam in a second direction parallel to the first surface of the support base and crossing the first direction to remove at least a part of protruding portions or contamination elements on the first surface of the support base.

A laser cleaning apparatus according to the present disclosure includes a stage supporting a support base having a first surface and a second surface parallel to the first surface; a light source unit for forming a laser beam; a positioning device changing at least one of a position and an orientation of the light source unit with respect to the stage; and a control device electrically connected with the light source unit and the positioning device, the control device controlling the light source unit and the positioning device. The control device causes the light source unit to form the laser beam in a first direction parallel to the first surface of the support base; and causes the positioning device to translate or rotate the laser beam in a second direction, parallel to the first surface of the support base and crossing the first direction, to remove at least a part of a protruding portion or a contamination element on the first surface of the support base.

Advantageous Effects of Invention

According to the method for producing a device support base and a laser cleaning apparatus of the present invention, a protruding portion or a contamination element on a support base is removed or decreased in size with no polishing. Therefore, a thin film formed on the support base is suppressed from being declined in quality, or a device formed on the support base is suppressed from being deteriorated in characteristics.

DESCRIPTION OF EMBODIMENTS

Figure 1A:
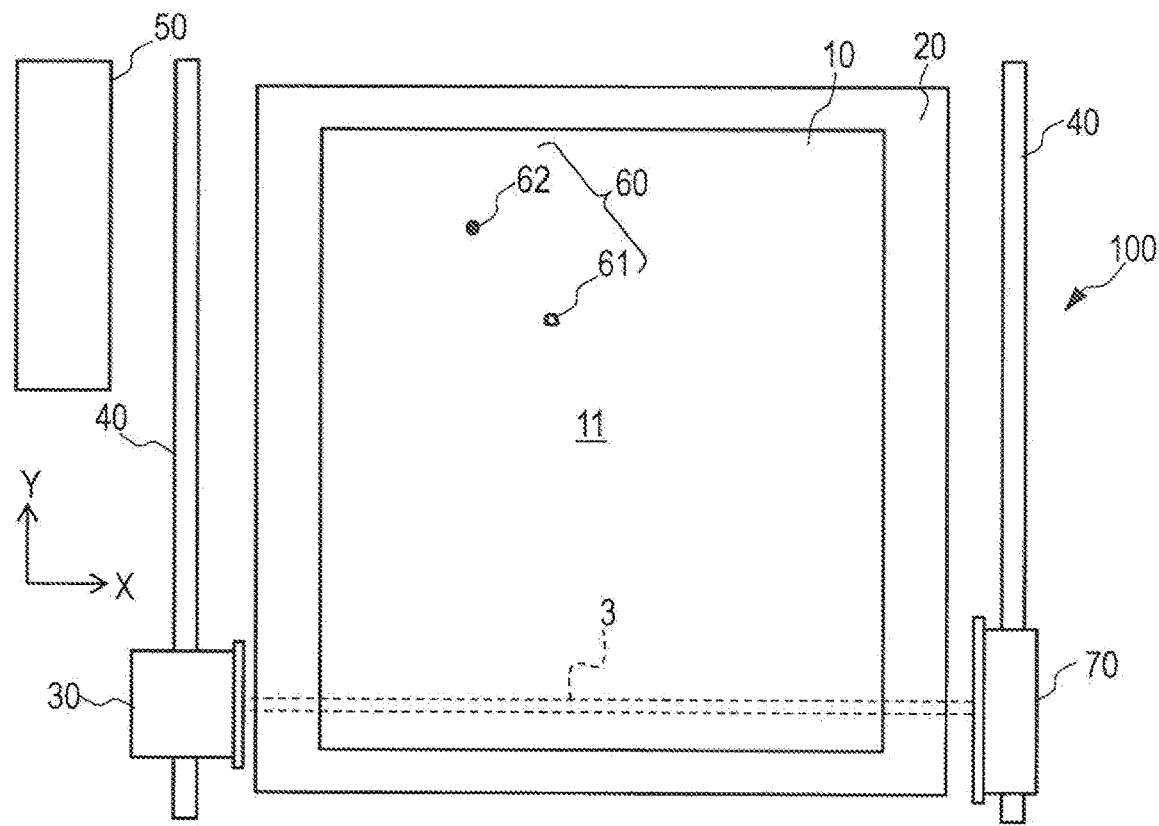
FIG. 1A is a plan view showing an example of structure of a laser cleaning apparatus in a first embodiment according to the present disclosure.
Figure 1B:
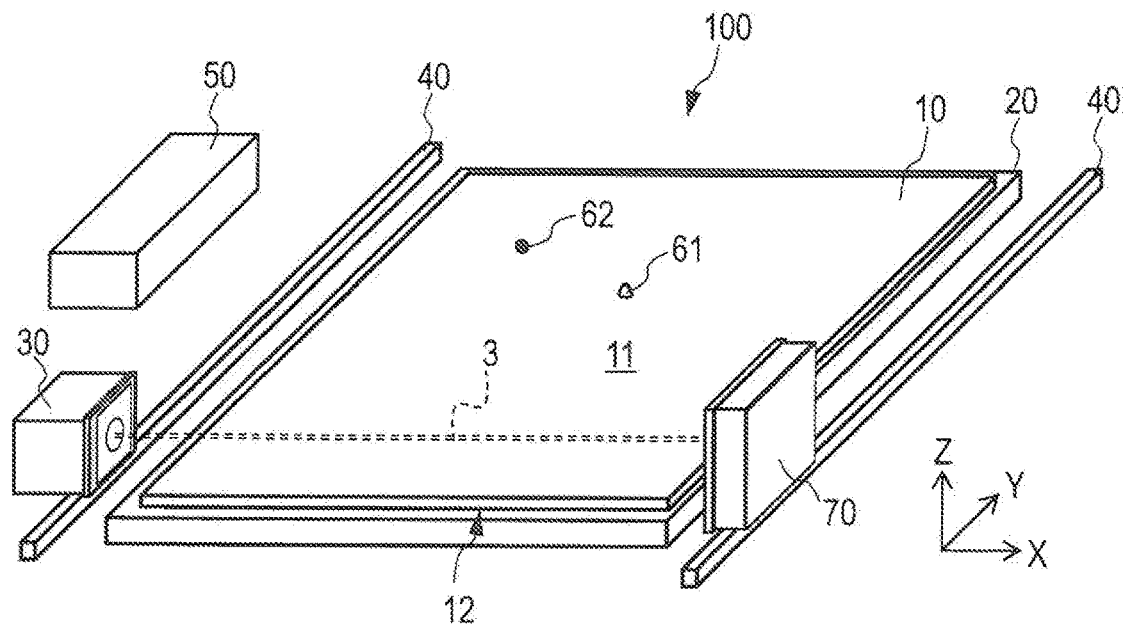
FIG. 1B is an isometric view showing the example of structure of the laser cleaning apparatus in the first embodiment according to the present disclosure.

First, with reference to FIG. 1A and FIG. 1B, an example of basic structure of a laser cleaning apparatus in an embodiment according to the present disclosure will be described. FIG. 1A and FIG. 1B are respectively a plan view and a cross-sectional view showing an example of structure in this embodiment. In the attached drawings, an X axis, a Y axis and a Z axis perpendicular to each other are shown for reference.

A laser cleaning apparatus in this embodiment (hereinafter, referred to as an "LC apparatus") 100 includes a stage 20 for holding a support base 10. The support base 10 has a first surface (top surface) 11 and a second surface (bottom surface) 12 parallel to the first surface 11. Examples of the support base 10 may include a plastic support base, a glass support base, a semiconductor support base, and a glass support base including a functional layer such as a resin layer, an insulating layer, a semiconductor layer or the like formed at a surface thereof. In this application, the definition of the term "parallel" is not limited to a mathematically strict definition of "parallel".

The stage 20 holds the support base 10 at the second surface 12 of the support base 10. A top surface of the stage 20 is typically flat, but may have a recessed portion such as a groove, a hole or the like for vacuum suction. In the example shown in the figures, the support base 10 in the state of being supported by the stage 20 is parallel to an XY plane. The XY plane is typically horizontal, but may be oriented in any direction as long as the stage 20 firmly supports the support base 10.

An unnecessary protruding portion 61 and/or contamination element 62 may be present on the first surface 11 of the support base 10. The protruding portion 61 is a part of the support base 10, whereas the contamination element 62 is a foreign object attached to the support base 10. The contamination element 62 is typically a foreign object called a "particle", and may be formed of any of various materials (organic material and/or inorganic material). The particle is often derived from a substance attached to a thin film deposition device, a transportation device or the like, or a substance floating in the air. The particle may be derived from a substance shaved out from the support base 10 during the transportation of the support base 10. Some of such particles may be strongly attached to the support base and may not be removable from a surface of the support base 10 by a cleaning step. In addition, the contamination element such as a particle or the like may be attached to the surface of the support base 10 after the cleaning step. In this application, such a protruding portion 61 and contamination element 62 may be collectively referred to as an irradiation target (target) 60 of a laser beam.

FIG. 1A and FIG. 1B show one protruding portion 61 and one contamination element 62 as an example. The number of the protruding portions 61 or the contamination elements 62 on the support base 10 is not limited to the above. For example, several to 100 particles may be attached to the first surface 11 of the support base 10 per unit area size (1 m$^2$). The particles may each have a size (diameter or height) of, for example, 1 to 5 µm. The LC apparatus 100, when detecting the protruding portions 61 and/or the contamination elements 62 present on the first surface 11 of the support base 10 with such a size and such a density, irradiates the protruding portions 61 and/or the contamination elements 62 with a laser beam to decrease the size of, or completely remove, each of the protruding portions 61 and/or the contamination elements 62 from the support base 10. In this embodiment, the protruding portions 61 and/or the contamination elements 62 are sensed by use of a laser beam as described below. Such sensing itself may be performed by a known method using an image sensor and an image processing technology.

In FIG. 1A and FIG. 1B, a laser beam 3 usable to irradiate the protruding portion 61 and/or the contamination element 62 is shown schematically by two dashed lines. One feature of this embodiment is that the propagation direction of the laser beam 3 is "parallel" to the first surface 11 of the support base 10. As described above, the definition of the term "parallel" in this application is not limited to the mathematically strict definition of "parallel". The relationship between the laser beam 3 and the first surface 11 of the support base 10 will be described below.

The LC apparatus 100 includes a light source unit 30 for forming the laser beam 3, a positioning device 40 changing at least one of a position and an orientation of the light source unit 30 with respect to the stage 20, and a control device 50 controlling the light source unit 30 and the positioning device 40.

The light source unit 30 may typically be a laser head including a semiconductor laser element, or an optical head of another type of solid-state laser or an gas laser. The positioning device 40 is typically a mechanical driving device drivable by an actuator such as an electric motor or the like. In the example shown in the figures, the positioning device 40 may move the light source unit 30 in a Y-axis direction along a guide rail and stop the light source unit 30 at any position. The position and the orientation of the light source unit 30 with respect to the stage 20 may be changed by adjusting a position and an orientation of the stage 20 in the state where the light source unit 30 is secured or is moving.

The control device 50 is electrically connected with the light source unit 30 and the positioning device 40 in a wired or wireless manner. The control device 50 typically includes a microcontroller, a memory and a communication interface mutually connected by a communication bus. The memory stores a software program that defines an operation of the microcontroller and the communication interface. The control device 50 may be a general-purpose computer in which a program for executing a laser cleaning processing operation is installed.

For performing a cleaning operation, the control device 50 causes the light source unit 30 to form the laser beam 3 in a first direction (X-axis direction) parallel to the first surface 11 of the support base 10. The control device 50 causes the positioning device 40 to translate the laser beam 3 in a second direction (Y-axis direction) parallel to the first surface 11 of the support base 10 and thus to remove at least a part of each of the irradiation targets 60 on the first surface 11 of the support base 10. The "translation" of the laser beam 3 does not need to be always performed in the state where the laser beam 3 is produced. While the laser beam 3 is crossing a region where no irradiation target 60 is present, the intensity of the laser beam 3 may be zero.

In the example shown in FIG. 1A and FIG. 1B, the second direction (Y-axis direction) is parallel to the first surface 11 of the support base 10 and is perpendicular to the first direction (X-axis direction). The second direction merely needs to be parallel to the first surface 11 of the support base 10 and cross the first direction. The second direction does not need to be perpendicular to the first direction.

In the example shown in the figures, the LC apparatus 100 includes a terminating device (beam damper) 70 receiving the laser beam 3 formed by the light source unit 30. The terminating device 70 absorbs the laser beam 3 and thus prevents generation of stray light. The laser beam 3 incident on the terminating device 70 is absorbed by, for example, a diffuser or the like in the terminating device 70. The terminating device 70 may be referred to as a beam absorber or a beam trap.

In this embodiment, the light source unit 30 and the terminating device 70 are respectively located at two opposing ends of the stage 20. The positioning device 40 may change at least one of a position and an orientation of the terminating device 70 as the translation (parallel movement in the Y-axis direction) of the laser beam 3 proceeds. More specifically, the control device 50 may control the positioning device 40 to move the light source unit 30 and the terminating device 70 to move in a direction parallel to the first surface 11 of the support base 10 (in the Y-axis direction).

Now, with reference to FIG. 2 through FIG. 10, the positional relationship between the laser beam 3 and the support base 10 will be described in detail.

Figure 2:
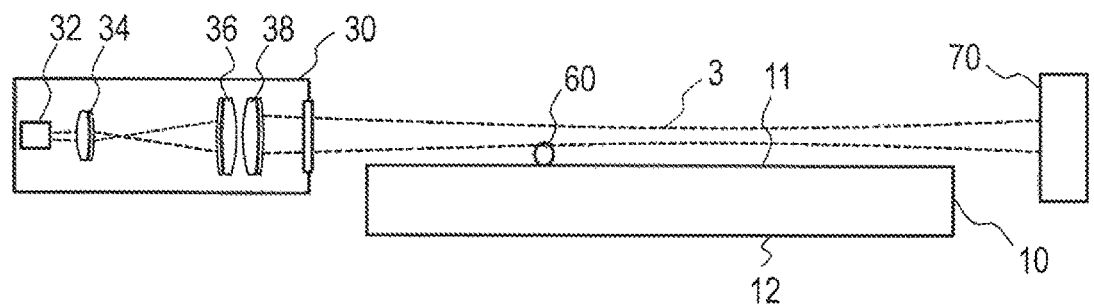
FIG. 2 is a cross-sectional view schematically showing an example of relationship between a laser beam and a first surface of a support base.

In the example shown in FIG. 2, the laser beam 3 is formed by the light source unit 30 including a light source 32 such as a semiconductor laser element or the like, and lenses 34, 36 and 38. The lenses 34, 36 and 38 form a collimation optical system. The laser beam 3, when being collimated, is approximately a bundle of parallel light beams, but the degree of divergence thereof cannot be made zero. Therefore, the beam has a longer diameter as being farther from a portion having the shortest diameter (from the beam waist) along an optical axis thereof.

The structure of the light source unit 30 is not limited to the structure shown in the figures. The light source 32 may be switched in accordance with the wavelength of the laser beam 3 to be produced. The wavelength of the laser beam 3 may be appropriately selected in accordance with the spectral absorption coefficient of the irradiation target 60. In the case where, for example, the irradiation target 60 contains quartz glass as a main component, laser light that is emitted from a carbon dioxide gas laser device or another gas dynamic laser device that oscillates at a wavelength of 10.6 µm is usable. Laser light emitted from such a laser device may be guided to the light source unit 30 via, for example, an optical fiber. In the case where the irradiation target 60 contains an organic material as a main component, laser light having a wavelength of 400 nm or shorter is preferably usable. The laser beam 3 may be of a pulse-like wave or a continuous wave (CW).

In the example shown in FIG. 2, the laser beam 3 is away from the first surface 11 of the support base 10. The distance from the first surface 11 to the laser beam 3 is set to be shorter than the height of the irradiation target 60. Therefore, at least a top portion of the irradiation target 60 is irradiated with the laser beam 3. It is now assumed that the particle as the irradiation target 60 has a height exceeding, for example, 1 µm. In this case, when the particle is shortened to have a diameter of, for example, 0.5 µm or shorter as a result of being irradiated with the laser beam 3, the particle may be considered to be made harmless (to be cleaned). The entirety of the irradiation target 60 does not need to be completely removed. The height of the irradiation target 60 that is permitted to remain on the first surface 11 of the support base 10 (upper-limit height) varies in accordance with the type of the thin film, or the structure of the device, to be formed on the support base 10. It is preferred that the distance from the first surface 11 of the support base 10 to the laser beam 3 is shorter than the upper-limit height, and may be set to, for example, 1 µm or shorter. The distance does not need to be kept constant during the irradiation with the laser beam 3. For example, an ultrasonic vibration may be applied to the support base 10 to fluctuate the distance. The distance may be different in accordance with the position on the first surface 11 of the support base 10.

Figure 3:
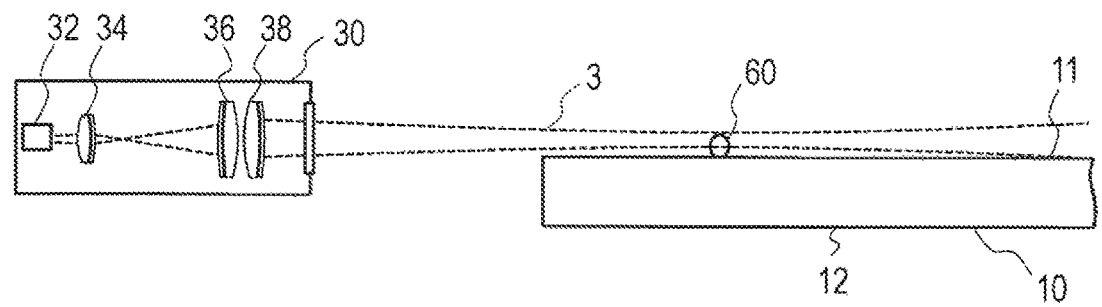
FIG. 3 is a cross-sectional view schematically showing another example of relationship between the laser beam and the first surface of the support base.

As shown in FIG. 3, as the distance between the laser beam 3 and the first surface 11 of the support base 10 is shortened, a part of the laser beam 3 may be incident on the first surface 11 of the support base 10. In this case, the first surface 11 reflects the laser beam 3. Hereinafter, this will be described.

Figure 4:
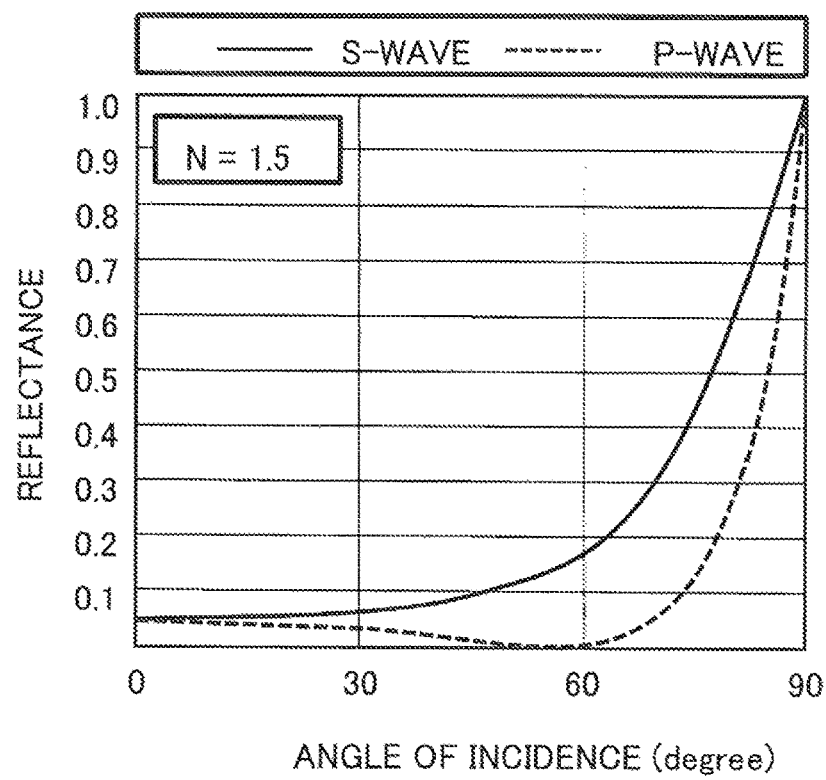
FIG. 4 is a graph showing the relationship between the angle of incidence and the reflectance in the case where a light beam is incident on a support base having a refractive index N of 1.5 from the air.

FIG. 4 is a graph showing the relationship between the angle of incidence and the reflectance in the case where a light beam is incident on the first surface 11 of the support base 10 having a refractive index N of 1.5 from the air (refractive index: 1.0). The solid line shows a case where the light beam is s-polarized light (polarization axis is perpendicular to the plane of incidence), whereas the dashed line shows a case where the light beam is p-polarized light (polarization axis is parallel to the plane of incidence). The graph in FIG. 4 is obtained from the Fresnel equations. Herein, the term "angle of incidence" is an angle between the normal to the first surface 11 of the support base 10 and the incident light beam.

In this embodiment of the present disclosure, the laser beam 3 is produced parallel to the first surface 11 of the support base 10. Therefore, even if a part of the laser beam 3 is incident on the first surface 11 of the support base 10, the angle of incidence is within a range of about 85 to 90 degrees. For this reason, even if a part of the laser beam 3 is incident on the first surface 11 of the support base 10, most of the incident light is reflected without being absorbed by the support base 10. From the point of view of making the reflectance close to 100%, it is preferred to use s-polarized light as the laser beam.

Figure 5:
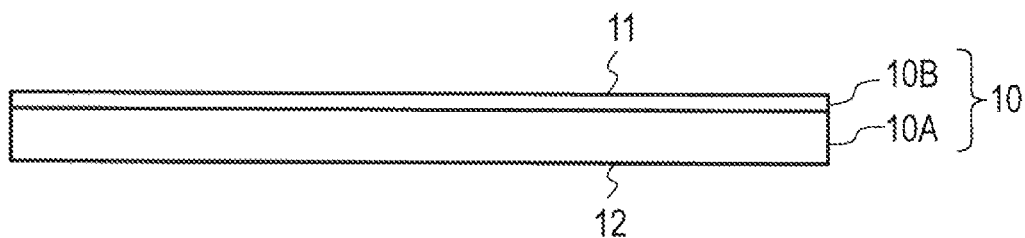
FIG. 5 is a cross-sectional view showing an example of structure of the support base.

The support base 10 does not need to be formed of a single material such as one glass support base, but may have a stack structure. An example of the support base 10 having a stack structure is an assembly of a glass plate and a resin (plastic) layer or a semiconductor layer such as a silicon layer formed on a surface of the glass plate. FIG. 5 is a cross-sectional view showing an example of structure of the support base 10. The support base 10 shown here includes a base 10A formed of a first material and a flexible film 10B supported by the base 10A and formed of a second material. The base 10A may be, for example, a glass plate. The flexible film 10B may be a polyimide resin layer having a thickness of, for example, 5 to 20 µm. The cross-sectional structure of the support base 10 is not limited to this. The support base 10 in this example may adjust the refractive index of the flexible film 10B to be higher or lower than the refractive index of the base 10A. As the refractive index of the surface of the support base 10 is higher, the reflectance of the s-polarized light is higher. The flexible film 10B itself may have a multilayer structure.

After various films or a device is formed on the flexible film 10B, the flexible film 10B is peeled off from the base 10A. As a result, a flexible device is produced. After being separated from the base 10A, the flexible film 10B acts as a "flexible substrate" of the flexible device. In this application, the support base that supports the device will be referred to as a "device support base". A typical example of the device supported by the device support base is an organic EL element, a thin film transistor element, or an array of such elements.

Figure 6:
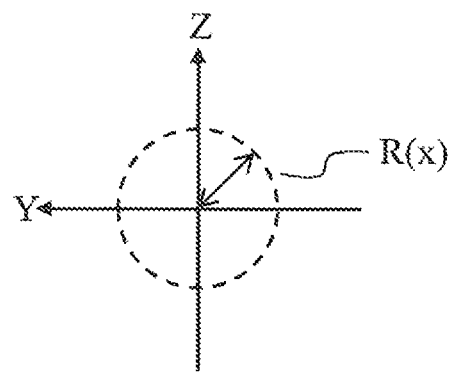
FIG. 6 shows a cross-section of the laser beam (plane parallel to a YZ plane).
Figure 7:
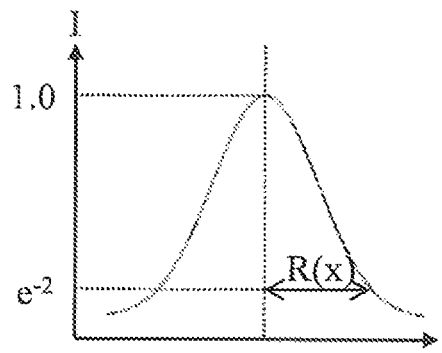
FIG. 7 shows the radial position dependence of intensity I of the laser beam.

FIG. 6 schematically shows a cross-section (plane parallel to a YZ plane) of the laser beam 3. FIG. 7 is a graph showing the radial position dependence (light intensity distribution) of intensity I. Intensity I of the laser beam 3 varies in accordance with the distance or radial position from the center of the beam (optical axis). As shown in FIG. 7, the distribution of intensity I may be approximated by, for example, a Gaussian distribution. Where the intensity on the central axis is 1.0, the cross-section of the laser beam 3 is formed of a region having an intensity of, for example, $e^{-2}$ or greater. Here, e is the base of natural logarithm. The cross-section of the laser beam 3 may be defined based another reference. In the case where the laser beam 3 is propagated in the X-axis direction, the beam radius of the laser beam 3 may be represented by R(x), which is a function of the x coordinate.

Figure 8:
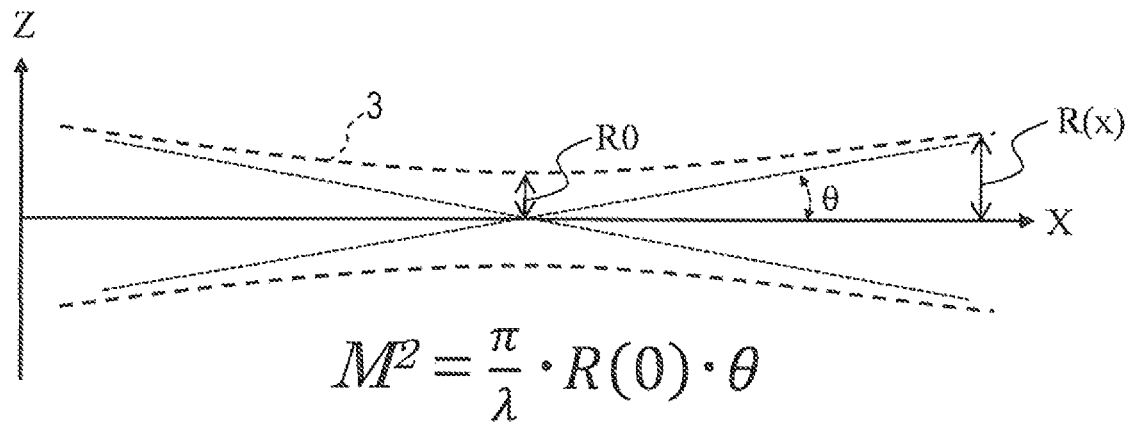
FIG. 8 schematically shows a beam radius $R(x)$ in a propagation direction of the laser beam (X axis direction).

FIG. 8 schematically shows the beam radius R(x) in the propagation direction of the laser beam 3 (X axis direction). Two dashed lines represent the beam profile, and R0 is the minimum value of the beam radius R(x). The beam radius R(x) is minimized at the beam waist. In FIG. 8, the angle between the two dotted lines (straight lines) defines the divergence angle θ of the beam. In order to increase the parallelism of the laser beam 3, it is preferred to decrease the divergence angle θ.

The quality of the laser beam 3 may be evaluated by the $M^2$ factor. Where the wavelength of the laser beam 3 is λ, the $M^2$ factor is represented by $(\lambda/\pi) \cdot R0 \cdot \theta$. The minimum value R0 of the beam radius and the divergence angle θ are inverse-proportional to each other. Therefore, as the minimum value R0 of the beam radius is smaller, the divergence angle θ is larger.

The $M^2$ factor of the laser beam 3 may be set to a value in the range of, for example, 1.0 to about 3.0, typically, about 1.1 to about 1.7. In the case where the divergence angle θ is 0.1 milliradian, R0 is about 3λ. The beam radius R(x) is about 0.1 mm (100 μm) at a position having a distance of 1 m from the beam waist.

Such a laser beam 3, while being outgoing from the light source unit 30 in a direction parallel to the first surface 11 of the support base 10, is translated or rotated. As a result, the irradiation target 60 located on the first surface 11 of the support base 10 may be irradiated with the laser beam 3. The irradiation target 60 irradiated with the laser beam 3 absorbs the energy of the laser beam 3 and thus is rapidly increased in temperature, and as a result, evaporated, volatilized or decomposed. As described above, the laser beam 3, even if being partially incident on the first surface 11 of the support base 10, is mostly reflected and is not absorbed by the support base 10 almost at all because the angle of incidence is about 90 degrees. However, on the irradiation target 60 located on an optical path of the laser beam 3, namely, on the surface of the protruding portion 61 or the contamination element (typically, particle) 62, the laser beam 3 has a small angle of incidence and a high transmittance. In the case where the irradiation target 60 is formed of a material not transparent for the laser beam 3 and absorbs light, the irradiation target 60 is selectively removed (cleaned) with no damage on the support base 10.

Figure 9:
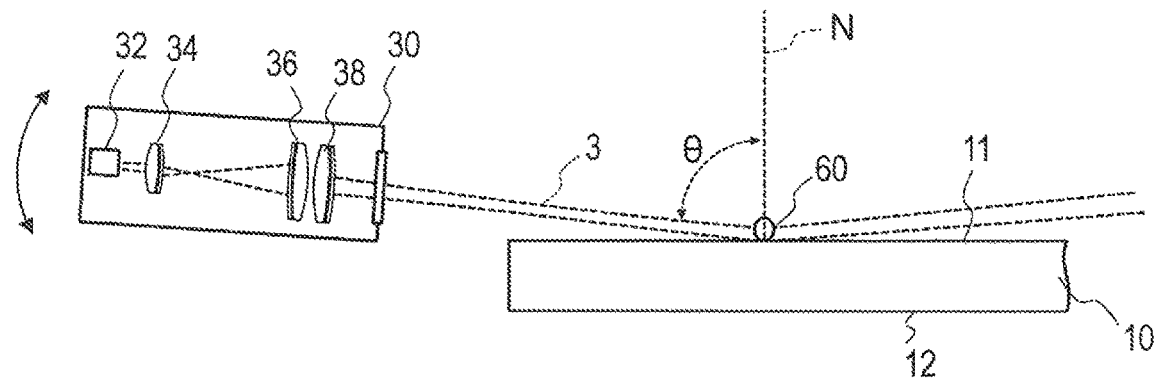
FIG. 9 is a cross-sectional view schematically showing still another example of relationship between the laser beam and the first surface of the support base.

FIG. 9 schematically shows a state where the laser beam 3 is incident on the first surface 11 of the support base 10 at an angle (angle of incidence) of 85 to 90 degrees, which is an angle between the optical axis thereof and normal N to the first surface 11, and is reflected. In this example, while the irradiation target 60 is present in the vicinity of the point of incidence, the energy of the laser beam 3 may be provided to the irradiation target 60. The light beam 3 may be focused on the point of incidence, so that the energy is provided to the irradiation target 60 at a high density. The orientation of the light source unit 30 may be adjusted as represented by the arrow in FIG. 9 to move (scan) the point of incidence along the first surface 11 of the support base 10. In the case where the position of the irradiation target 60 is specified, the light beam 3 may be focused on the position.

Figure 10:
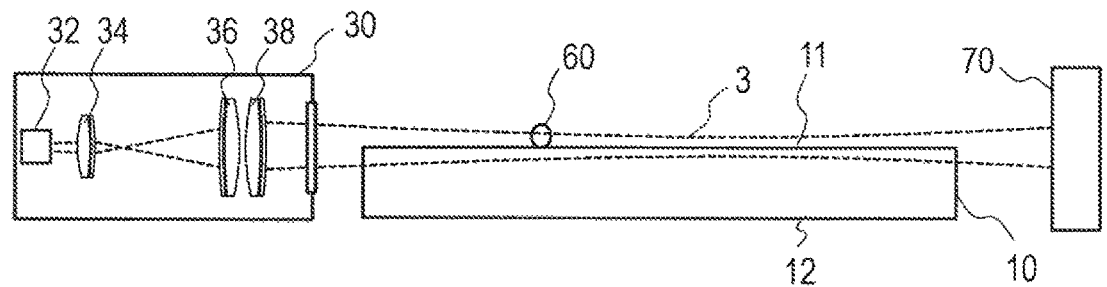
FIG. 10 is a cross-sectional view schematically showing still another example of relationship between the laser beam and the first surface of the support base.

In the example shown in FIG. 10, a part of the laser beam 3 is propagated between the first surface 11 and the second surface 12 of the support base 10. At least a bottom portion of the irradiation target 60 is irradiated with the laser beam 3. The support base 10 may be formed of a material transparent for the laser beam 3, so that the support base 10 does not absorb the laser beam 3 and is not increased in temperature. In this example, a part of the laser beam 3 is incident on an end surface of the support base 10. This end surface may be covered with a reflection-preventive film. In the case where the support base 10 is formed of a material absorbing the laser beam 3, the end surface may be covered with a reflective film. The laser beam 3 reflected by the reflective film is not absorbed by the support base 10. It is preferred that an optical system is designed such that the reflective light is not returned to the light source 32 as stray light and that a structural body substantially the same as the terminating device 70 is provided inside, or in the vicinity of, the light source unit 30.

As described above, in this embodiment of the present disclosure, the expression that the propagation direction of the laser light 3 and the first surface 11 of the support base 10 are "parallel" to each other is taken in a broad sense. Specifically, as long as the angle between the normal to the first surface 11 of the support base 10 and the central axis (optical axis) of the laser beam 3 is in the range of 90 degrees±5 degrees, the laser beam 3 is considered to be produced parallel to the first surface 11 of the support base 10.

Figure 11:
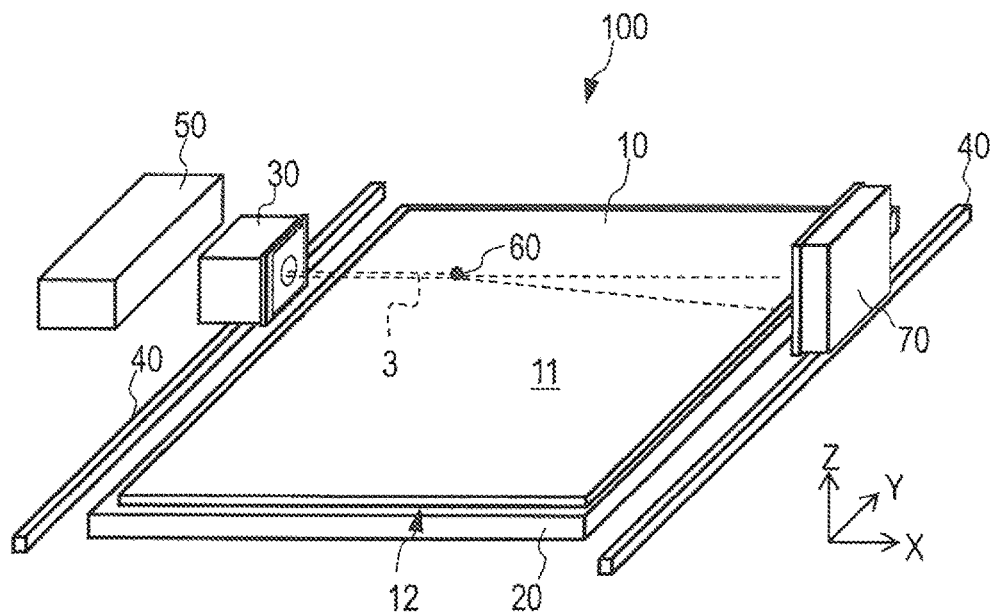
FIG. 11 is an isometric view schematically showing a state where a contamination element having a particle shape is irradiated with the laser beam.

FIG. 11 is an isometric view schematically showing a state where the irradiation target 60 having a particle shape is irradiated with the laser beam 3. A part of the laser beam 3 may be reflected or scattered by the irradiation target 60.

The laser beam 3 may be used to detect the irradiation target 60. While the laser beam 3 having a relatively low intensity is produced, the light source unit 30 and the terminating device 70 are moved in, for example, the X-axis direction in FIG. 11. The rate of the movement is, for example, 1 to 100 mm/sec. The distance by which the light source unit 30 and the terminating device 70 are moved varies in accordance with the size of the support base 10 in the moving direction of the light source unit 30 and the terminating device 70. In the case where the size is, for example, 1 m or longer, it is desired that the rate of the movement is, for example, 5 mm/sec. or higher from the point of view of shortening the processing time (tact time). The terminating device 70 may include a photodetector (intensity sensor) such as a photodiode or the like, so that it is sensed that the irradiation target 60 is located on the optical path of the laser beam 3 based on a change in the output from the intensity sensor. When this is sensed, the intensity of the laser beam 3 is increased without changing the position thereof. As a result, the irradiation target 60 is increased in temperature and is removed.

Figure 12:
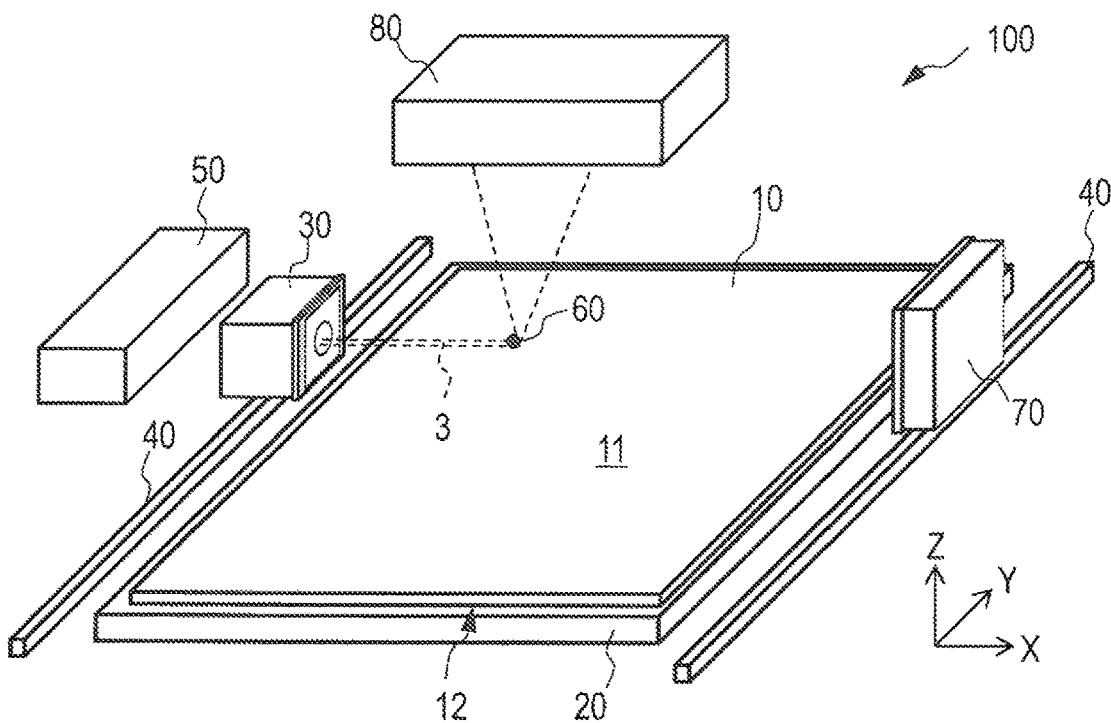
FIG. 12 is an isometric view showing an example in which an image capturing device provided at a position facing the first surface of the support base captures an image of an irradiation target illuminated by being irradiated with the laser beam.

FIG. 12 is an isometric view showing an example in which an image capturing device 80 provided at a position facing the first surface 11 of the support base 10 captures an image of the irradiation target 60 illuminated by being irradiated with the laser beam 3. The image capturing device 80 typically includes an image sensor and an imaging lens. On an imaging surface of the image sensor, an image of the irradiation target 60 illuminated by being irradiated with the laser beam 3 is formed. Image data output from the image capturing device 80 may be processed by the control device 50, so that position coordinates of the irradiation target 60 are detected. In the example shown in FIG. 11, the X coordinate of the irradiation target 60 is not detected. In the example shown in FIG. 12, the X coordinate and the Y coordinate of the irradiation target 60 are both detected. In the case where the light source unit 30 includes an optical system capable of changing the focal distance, the convergence point (beam waist) of the laser beam 3 may be matched to the position of the irradiation target 60 to increase the density of the energy with which the irradiation target 60 is irradiated (see FIG. 9). In the case where the LC apparatus 100 includes a plurality of the light source units 30, a plurality of the laser beams 3 may be formed by the plurality of light source units 30 located at different positions at the same time or sequentially to irradiate one, same irradiation target 60 with the plurality of laser beams 3.

Figure 13:
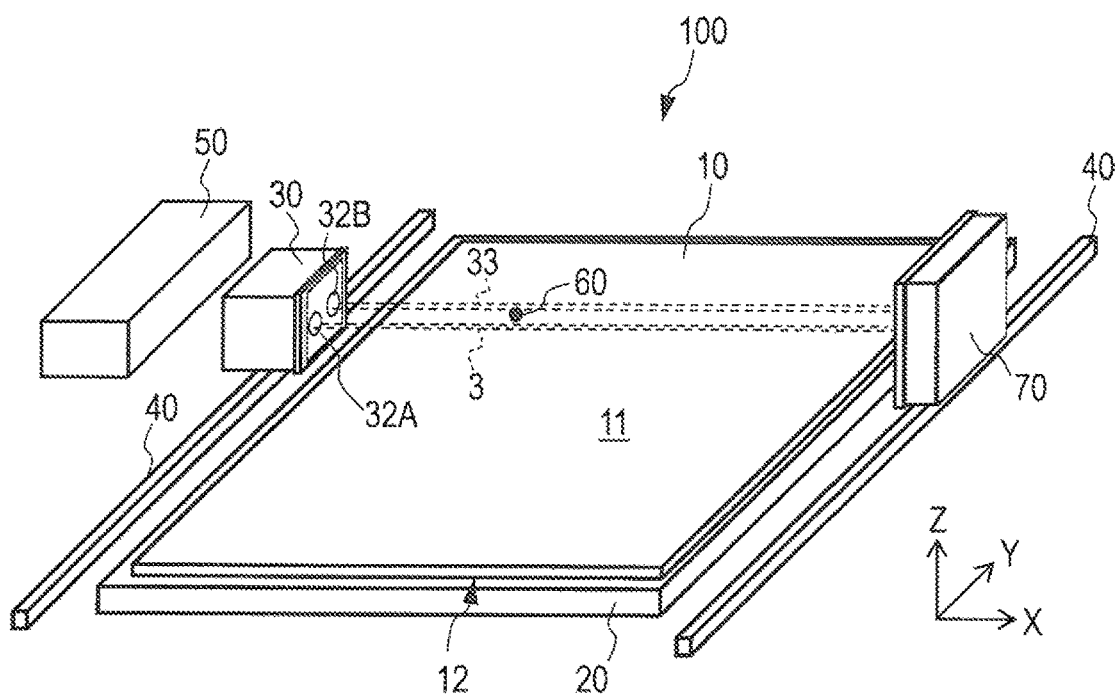
FIG. 13 is an isometric view showing another example of structure in an embodiment according to the present disclosure.

FIG. 13 is an isometric view showing an example in which the light source unit 30 includes a first light source 32A for forming the laser beam 3 usable to remove the irradiation target 60 and a second light source 32B for forming a laser beam 33 usable to detect the irradiation target 60 (hereinafter, this laser beam will be referred to as a "detection laser light 33"). While the detection laser light 33 having a relatively low intensity is produced, the light source unit 30 and the terminating device 70 are moved in the X-axis direction in FIG. 13. The terminating device 70 includes a photodetector (intensity sensor), such as a photodiode or the like, located at a position where the detection laser light 33 is incident. When it is sensed that the irradiation target 60 is present on an optical path of the detection laser light 33 based on a change in the output from the photodetector, the first light source 32A produces the laser beam 3. The light source unit 30 and the terminating device 70 are moved in the X-axis direction in FIG. 13 in this state. In this manner, the irradiation target 60 is irradiated with the laser beam 3 to increase the temperature of at least a part of the irradiation target 60 and thus to remove the irradiation target 60. In the case where an error range is assumed for the position of the irradiation target 60 detected by the detection laser light 33, the light source unit 30 and the terminating device 70 may be moved in a reciprocating manner in the X-axis direction while the laser beam 3 is formed by the first light source 32A. The amplitude of the reciprocating movement is determined in accordance with the value of the error range.

Figure 14:
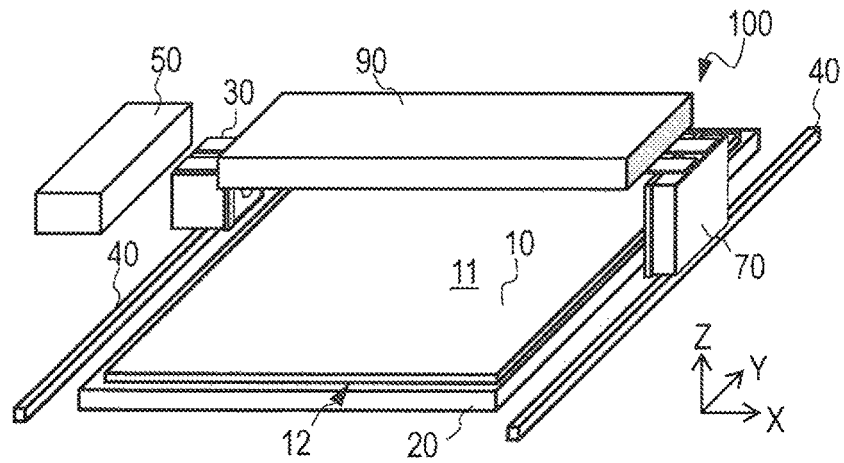
FIG. 14 is an isometric view showing still another example of structure in an embodiment according to the present disclosure.

FIG. 14 shows a gas flow device 90, which distances a component, volatilized or decomposed from the irradiation target 60 as a result of the irradiation target 60 being irradiated with the laser beam 3, away from the first surface 11 of the support base 10 by a gas flow. The gas flow may be caused by a mechanism that at least either blows or absorbs atmospheric gas or inert gas. Such a gas flow prevents or suppresses foreign objects from being attached to the first surface 11 of the support base 10 as a result of the irradiation with the laser beam 3. An example of mechanism that both blows and absorbs gas is a device that absorbs, through an absorption opening, gas blown to the support base 10 by a blowing nozzle. Such a device effectively collects the substance generated by the irradiation with the laser beam 3.

Figure 15:
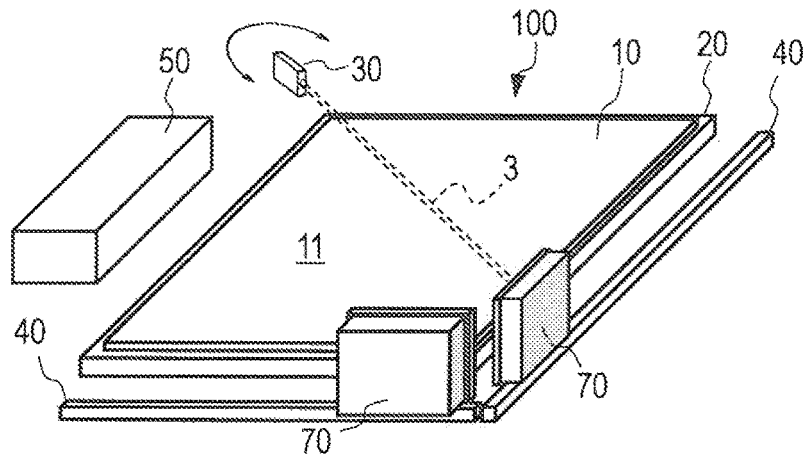
FIG. 15 is an isometric view showing still another example of structure in an embodiment according to the present disclosure.
Figure 16:
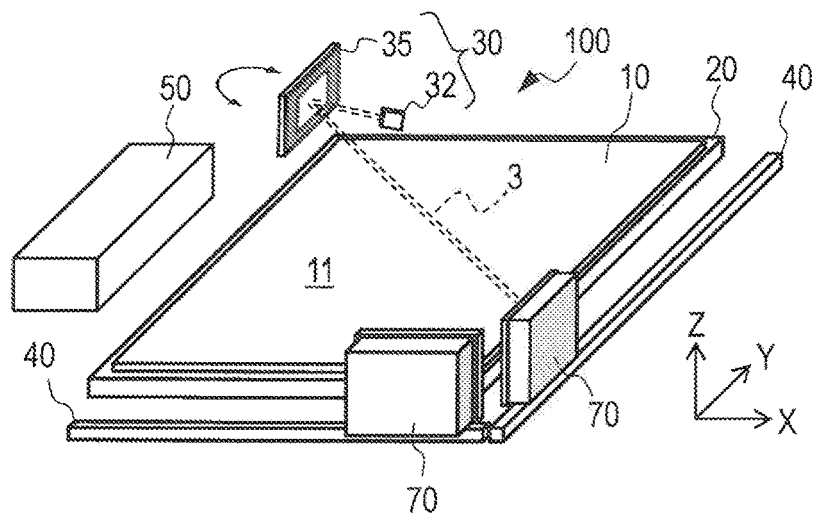
FIG. 16 is an isometric view showing still another example of structure in an embodiment according to the present disclosure.

FIG. 15 shows an example of structure in which the laser beam 3 is rotated instead of being translated. The light source unit 30 is pivotable about an axis perpendicular to the first surface 11 of the support base 10. FIG. 16 shows another example of structure in which the laser beam 3 is rotated instead of being translated. The light source 32 may be secured and a mirror 35 may be changed in at least orientation and position, so that the laser beam 3 is rotated. In the case where such a structure is adopted, the position of the terminating device 70 is moved as the rotation of the laser beam 3 proceeds.

As described above, according to the laser cleaning apparatus of the present disclosure, after step A of providing the support base 10 is performed, step B of forming the laser beam 3 in the first direction parallel to the first surface 11 of the support base 10; and step C of translating or rotating the laser beam 3 in a second direction, parallel to the first surface 11 of the support base 10 and crossing the first direction, to remove at least a part of protruding portions or contamination elements on the first surface 11 of the support base 10; are performed. Therefore, various device support bases that are not easily deteriorated in performance, or are not easily made defective, by microscopic protrusions are produced.

In an embodiment including step D of, before the step B, scanning a plane parallel to the first surface 11 of the support base 10 by detection laser light having a lower intensity than the intensity of the laser beam used in the step B to detect a position of each of the protruding portions or the contamination elements on the first surface 11 of the support base 10, the laser beam is sequentially directed toward the positions of the protruding portions or the contamination elements in the step B.

INDUSTRIAL APPLICABILITY

An embodiment of the present invention is applicable to production of, for example, an organic EL device, especially a flexible organic EL device.

REFERENCE SIGNS LIST 3 laser beam
10 support base
11 first surface of the support base
12 second surface of the support base
20 stage
30 light source unit
33 detection laser light
40 positioning device
50 control device
60 irradiation target of laser beam (target)
61 protruding portion
62 contamination element
70 terminating device
100 laser cleaning apparatus (LC apparatus)

The invention claimed is:

1. A method for producing a support base, comprising:
   step A of providing a support base having a first surface and a second surface parallel to the first surface;
   step B of forming a laser beam in a first direction parallel to the first surface of the support base; and
   step C of translating or rotating the laser beam in a second direction parallel to the first surface of the support base and crossing the first direction to remove at least a part of protruding portions or contamination elements on the first surface of the support base,
   wherein the method further comprises step D of, before the step B, scanning a plane parallel to the first surface of the support base by detection laser light having a lower intensity than an intensity of the laser beam in the step B to detect a position of each of the protruding portions or the contamination elements on the first surface of the support base;
   wherein the laser beam in the step B is sequentially directed to the positions of the protruding portions or the contamination elements.

2. The method of claim 1, further comprising step E of moving, by a gas flow, at least the part of the protruding portions or the contamination elements removed in the step B in a direction away from the first surface of the support base.

3. The method of claim 1, wherein:
   the support base includes:
     a base formed of a first material; and
     a film formed of a second material different from the first material, the film being supported by the base; and
   a surface of the film is the first surface of the support base.

4. The method of claim 1, wherein:
   the step A includes a step of placing the support base on a top surface of a stage; and
   the second surface of the support base is supported by the top surface of the stage.

5. A laser cleaning apparatus, comprising:
   a stage supporting a support base having a first surface and a second surface parallel to the first surface;
   a light source unit for forming a laser beam;
   a positioning device changing at least one of a position and an orientation of the light source unit with respect to the stage;
   a control device electrically connected with the light source unit and the positioning device, the control device controlling the light source unit and the positioning device; and
   an intensity sensor having at least one of a position and an orientation thereof be changeable by the positioning device;
   wherein the control device:
     causes the light source unit to form the laser beam in a first direction parallel to the first surface of the support base;
     causes the positioning device to translate or rotate the laser beam in a second direction, parallel to the first surface of the support base and crossing the first direction, to remove at least a part of a protruding portion or a contamination element on the first surface of the support base;
     causes the light source unit to emit detection laser light having a lower intensity than an intensity of the laser beam;
     causes the positioning device to scan a plane parallel to the first surface of the support base by the detection laser light and to change at least one of the position and the orientation of the intensity sensor as the scanning by the detection laser light proceeds; and
     in the case where a position of the protruding portion or the contamination element on the first surface of the support base is detected based on an output from the intensity sensor, causes the light source unit to form the laser beam, instead of the detection laser light, toward the position of the protruding portion or the contamination element.

6. The laser cleaning apparatus of claim 5, further comprising a terminating device receiving the laser beam formed by the light source unit.

7. The laser cleaning apparatus of claim 6, wherein the positioning device changes at least one of a position and an orientation of the terminating device as the translation or the rotation of the laser beam proceeds.

8. The laser cleaning apparatus of claim 7, wherein:
   the light source unit and the terminating device are respectively located at two opposing ends of the stage; and
   the control device causes the positioning device to move the light source unit and the terminating device in a direction parallel to the first surface of the support base.

9. The laser cleaning apparatus of claim 8, wherein the control device causes the positioning device to move the light source unit and the terminating device in a direction perpendicular to the first direction.

10. The laser cleaning apparatus of claim 8, wherein the control device causes the positioning device to move the light source unit and the terminating device in a direction perpendicular to the first direction.

11. The laser cleaning apparatus of claim 5, wherein:
    the light source unit and the intensity sensor are respectively located at two opposing ends of the stage; and
    the control device causes the positioning device to move the light source unit and the intensity sensor in a direction perpendicular to the first direction.

* * * * *